United States Patent
Okamoto et al.

[11] Patent Number: 5,892,668
[45] Date of Patent: Apr. 6, 1999

[54] NOISE-CUT FILTER FOR POWER CONVERTER

[75] Inventors: Kenji Okamoto; Shinji Uchida; Takao Maeda, all of Kanagawa; Takashi Aihara, Tokyo; Yoshihiro Matsumoto, Mie; Naoto Fukasawa, Kanagawa, all of Japan

[73] Assignee: Fuji Electric Company, Ltd., Japan

[21] Appl. No.: 872,541

[22] Filed: Jun. 10, 1997

[30] Foreign Application Priority Data

Jun. 10, 1996 [JP] Japan ................................. 8-146847
Mar. 14, 1997 [JP] Japan ................................. 9-061504

[51] Int. Cl.⁶ ............................. H02M 1/12; H03H 7/00
[52] U.S. Cl. ........................................... 363/40; 333/181
[58] Field of Search ...................... 363/39, 40; 333/177, 333/181, 184, 185; 323/355, 356; 336/181; 361/113

[56] References Cited

U.S. PATENT DOCUMENTS

| | | | |
|---|---|---|---|
| 3,683,271 | 8/1972 | Kobayashi | 323/355 |
| 4,999,597 | 3/1991 | Gaynor | 333/246 |
| 5,124,888 | 6/1992 | Suzuki et al. | 361/395 |
| 5,159,300 | 10/1992 | Nakamura et al. | 333/184 |
| 5,250,915 | 10/1993 | Ikeda et al. | 333/181 |

*Primary Examiner*—Adolf Denske Berhane
*Attorney, Agent, or Firm*—Rossi & Associates

[57] ABSTRACT

A noise-cut filter device for a power converter, including at least one noise-cut filter, for filtering switching noise occurring upon a switching operation of a semiconductor switching device of the power converter is disclosed. In this filter device, the noise-cut filter includes first and second planar conductors, and a dielectric sheet having upper and lower surfaces on which the first and second conductors are disposed to face each other through the dielectric sheet. The first and second planar conductors cooperate with the dielectric sheet to form a circuit having both functions of an inductor and a condenser. The current of a main circuit of the power converter flows through the opposite ends of the first planar conductor, while the current based on the switching noise, which flows from the first conductor to the second conductor, is led to ground by the second conductor.

40 Claims, 9 Drawing Sheets

NOISE-CUT FILTER FOR POWER CONVERTER

FIELD OF THE INVENTION

The present invention generally relates to noise-cut filters for power converters, and in particular to noise-cut filters for filtering switching noises that occur upon switching operations of semiconductor switching devices of a power converter, such as an inverter.

BACKGROUND OF THE INVENTION

Semiconductor switching devices of a power converter, such as an inverter, perform switching operations based on drive signals which undergo pulse width modulation (PWM) where the carrier frequency is in the range of about several KHz to about twenty KHz. Due to these switching operations, switching noises having frequency components of several dozens of KHz are generated from the power converter.

Since frequency components of the switching noises that are greater than one hundred KHz have adverse influences on external equipment, various legal regulations have been laid on power converters in recent years, in an attempt to reduce or eliminate such adverse influences. To deal with these regulations, noise-cut filters are installed on the power converters.

A known example of noise-cut filter for a power converter includes a single reactor formed by winding an electric wire around a core, such as of ferrite, amorphous alloy or crystalline alloy, and a single condenser in the form of a film or a chip. The reactor and the condenser are coupled into an inverted L-shape, to thus provide a filter for filtering switching noises that occur upon switching operations of semiconductor switching devices of the power converter.

The reactor used in this known type of noise-cut filter generally has a toroidal shape, and the condenser is a pin-inserted type and has a flat shape or a cylindrical shape. Where these reactor and condenser are mounted on a printed board within the power converter, space required for mounting will be greater than the sum of volumes of individual elements. Further, mounting of such filters with separate wiring results in an undesirably large number of coupling portions, and a complicated manner of fixing individual components.

Commercially available so-called composite LC filters of a chip type or pin-inserted type, in which an inductor and a condenser are integrated, have a cut-off frequency of several MHz or higher, whereas the cut-off frequency normally needed to filter switching noises occurring upon switching operations of semiconductor switching devices is as low as about 150 KHz, for example. Further, in a power converter such as an inverter, several amperes of current is required to flow through the commercially available filter. Thus, it has been difficult to employ the commercially available, low-cost composite LC filter for use in the power converter.

SUMMARY OF THE INVENTION

It is therefore an object of the present invention to provide a noise-cut filter for a power converter which solves the above problems.

To accomplish the above object, there is provided according to a first aspect of the invention a noise-cut filter device for a power converter, including a plurality of noise-cut filters, for filtering switching noise occurring upon a switching operation of a semiconductor switching device of the power converter, wherein each of the plurality of noise-cut filters comprises first and second planar conductors, and a dielectric sheet having upper and lower surfaces on which the first and second conductors are disposed to face each other through the dielectric sheet, the first and second planar conductors cooperating with the dielectric sheet to form a circuit having both functions of an inductor and a condenser, the first planar conductor having opposite ends through which a current of a main circuit of the power converter flows, the second planar conductor leading a current based on the switching noise to ground, which current flows from the first planar conductor to the second planar conductor through the dielectric sheet.

The above-indicated dielectric sheet of each of the noise-cut filters may be formed of a polymeric resin material, or may be formed of a polymeric resin material that is mixed with an inorganic filler having a high dielectric constant in a predetermined proportion, or may be formed of a ceramic material.

In another form of the first aspect of the invention, the above-indicated dielectric sheet of each of the noise-cut filters is formed from a green sheet of a ceramic dielectric material, and the first and second planar conductors are formed from respective metallic plates by press working, the metallic plates and the green sheet being stuck with pressure and sintered to provide the each noise-cut filter.

At least one of the first and second planar conductors of each noise-cut filter may comprise a first metallic plate fixed to a surface of the dielectric sheet and formed into a given shape by etching, and a second metallic plate that is pressed into the same shape as the first metallic plate, the second metallic plate being soldered to the first metallic plate. In another form of the invention, the second metallic plate is bonded to the first metallic plate by a conductive adhesive.

At least one of the first and second planar conductors of each of the noise-cut filters may comprise a metallic film formed in a given pattern on a surface of the dielectric sheet by vapor deposition or sputtering, and a copper layer formed with a predetermined thickness on the metallic film by plating.

At least one of the first and second planar conductors of each of the noise-cut filters may comprise a metallic film formed in a given pattern on a surface of the dielectric sheet by vapor deposition or sputtering, and a metallic plate that is pressed into the same shape as the metallic film and soldered to the metallic film. In another form of the invention, the metallic plate is secured to the metallic film by means of a conductive adhesive.

Each of the first and second planar conductors of the each planar noise-cut filter may have a swirl-like shape or a hoop-like shape. In this case, each planar conductor may have at least one corner portion which is curved with a given radius of curvature. Further, an area over which the first and second planar conductors face each other may be controlled by changing an area of the second planar conductor for leading the current based on the noise to ground, by trimming, for example.

In the noise-cut filter device as described above, each noise-cut filter may have a through hole formed in a middle portion thereof, and magnetic core halves may be provided which surround the outer periphery of the noise-cut filters and are inserted through the through holes of the filters. In this case, the magnetic core halves cooperate with the first and second planar conductors to provide a magnetic circuit.

In the noise-cut filter device as described above, each noise-cut filter may have a through hole formed in a middle portion thereof, and an insulating, magnetic-powder-dispersed resin in which ferromagnetic powder is dispersed may be provided for sealing the outer periphery of the noise-cut filters and the through holes of the filters. In this case, the ferromagnetic powder cooperates with the first and second planar conductors to provide a magnetic circuit.

Each of the above-described noise-cut filters may be installed between the power converter and each of input conductors for transmitting input current to the power converter, or between the power converter and each of output conductors for receiving output current from the power converter. The above-indicated each noise-cut filter may also be installed in each of conductor portions of a main circuit within the power converter.

According to a second aspect of the present invention, there is provided a noise-cut filter device for a power converter, including a plurality of noise-cut filters, for filtering switching noise occurring upon a switching operation of a semiconductor switching device of the power converter, wherein each of the plurality of noise-cut filters comprises first and second conductors, and a dielectric sheet having first and second surfaces on which the first and second conductors are disposed to face each other through the dielectric sheet, the first and second conductors cooperating with the dielectric sheet to form a circuit having both functions of an inductor and a condenser; wherein the first conductor formed on the first surface of the dielectric sheet has opposite ends through which a current of a main circuit of the power converter flows, and wherein the second conductor comprises a conductive adhesive formed in a given shape on the second surface of the dielectric sheet by coating, for leading a current based on the noise to ground, which current flows from the first conductor to the second conductor through the dielectric sheet.

The above-indicated first planar conductor may comprise a conductive adhesive formed in a given shape on the first surface of the dielectric sheet by coating, and a metallic wire fixed to the conductive adhesive.

In one preferred form of the first aspect of the invention, the dielectric sheet is formed from a dielectric ceramic green sheet obtained by forming a mixture of a dielectric ceramic powder and an organic binder into a planar shape, and the first and second planar conductors are formed by printing patterned conductive pastes comprising a conductive powder, an organic binder and an organic solvent, onto upper and lower surfaces of the dielectric ceramic green sheet, respectively. The patterned conductive pastes and the dielectric ceramic green sheet are then concurrently degreased and sintered so as to form each of the plurality of noise-cut filters.

Where the noise-cut filter device further includes a plurality of insulating sheets inserted between adjacent ones of the plurality of noise-cut filters, each of the insulating sheets may be formed from an insulating ceramic green sheet obtained by forming a mixture of an insulating ceramic powder and an organic binder into a planar shape, and the above-indicated dielectric ceramic green sheet, the patterned conductive pastes, and the insulating ceramic green sheet may be brought into pressure-sticking with each other, and concurrently degreased and sintered so as to provide each of the plurality of noise-cut filters.

In another form of the first aspect of the invention, the dielectric sheet is formed from a dielectric ceramic green sheet obtained by forming a mixture of a dielectric ceramic powder and an organic binder into a planar shape, and the first and second planar conductors are formed from first and second conductive ceramic green sheets each obtained by forming a mixture of conductive powder and an organic binder into a planar shape, the first and second conductive ceramic green sheets being respectively formed in a predetermined pattern on upper and lower surfaces of the dielectric ceramic green sheet. The first and second conductive ceramic green sheets and the dielectric ceramic green sheet are then brought into pressed contact with each other, and concurrently degreased and sintered so as to form each of the plurality of noise-cut filters.

Where the noise-cut filter device further includes a plurality of insulating sheets inserted between adjacent ones of the plurality of noise-cut filters, each of the insulating sheets may be formed from an insulating ceramic green sheet obtained by forming a mixture of an insulating ceramic powder and an organic binder into a planar shape, and the above-indicated dielectric ceramic green sheet, the conductive ceramic green sheets, and the insulating ceramic green sheet may be brought into pressure-sticking with each other, and concurrently degreased and sintered so as to provide each of the plurality of noise-cut filters.

In a further preferred form of the first aspect of the invention, the dielectric sheet is formed from a dielectric ceramic green sheet obtained by forming a mixture of a dielectric ceramic powder and an organic binder into a planar shape, and one of the first and second planar conductors is formed by printing a patterned conductive paste comprising a conductive powder, an organic binder and an organic solvent, onto a first surface of the dielectric ceramic green sheet, while the other of the first and second planar conductors is formed from a conductive ceramic green sheet obtained by forming a mixture of conductive powder and an organic binder into a planar shape, the conductive ceramic green sheet being formed in a predetermined pattern on a second surface of the dielectric ceramic green sheet. The patterned conductive paste, the dielectric ceramic green sheet and the conductive ceramic green sheet are then concurrently degreased and sintered so as to form each of the plurality of noise-cut filters.

Where the noise-cut filter device further includes a plurality of insulating sheets inserted between adjacent ones of the plurality of noise-cut filters, each of the insulating sheets may be formed from an insulating ceramic green sheet obtained by forming a mixture of an insulating ceramic powder and an organic binder into a planar shape, and the above-indicated dielectric ceramic green sheet, the patterned conductive paste, the conductive ceramic green sheet, and the insulating ceramic green sheet may be brought into pressed contact with each other, and concurrently degreased and sintered so as to provide each of the plurality of noise-cut filters.

In a still further form of the first aspect of the present invention, the noise-cut filter device further comprises a plurality of insulating sheets inserted between adjacent ones of the noise-cut filters, each of the insulating sheets being formed from an insulating ceramic green sheet obtained by forming a mixture of insulating ceramic powder and an organic binder into a planar shape, and a magnetic body formed from a magnetic ceramic green as a mixture of a magnetic ceramic powder and an organic binder. In producing this noise-cut filter device, the dielectric sheet may be formed from a dielectric ceramic sheet obtained by forming a mixture of a dielectric ceramic powder and an organic binder into a planar shape, and the first and second planar conductors may be formed by printing patterned conductive pastes comprising a conductive powder, an organic binder and an organic solvent, onto upper and lower surfaces of the dielectric ceramic green sheet. These dielectric ceramic green sheet and conductive pastes, and the above insulating ceramic green sheet may be stuck together with pressure into an integral green body, which is then formed with a through hole extending through a middle portion thereof. In this case, the above-indicated magnetic ceramic green fills the through hole and surrounds the outer periphery of the integral green body, and the magnetic ceramic green and the integral green body are concurrently degreased and sintered so as to provide each of the plurality of noise-cut filters.

In the above form of the invention, the first and second planar conductors may be formed from first and second conductive ceramic green sheets each obtained by forming a mixture of a conductive powder and an organic binder into a planar shape, such that the first and second conductive ceramic green sheets are respectively formed in a predetermined pattern on upper and lower surfaces of the dielectric ceramic sheet. Alternatively, one of the first and second planar conductors may be formed by printing a patterned conductive paste comprising a conductive powder, an organic binder and an organic solvent, onto a first surface of the dielectric ceramic green sheet, and the other planar conductor may be formed from a conductive ceramic green sheet obtained by forming a mixture of a conductive powder and an organic binder into a planar shape, the conductive ceramic green sheet being formed in a predetermined pattern on a second surface of the dielectric ceramic green sheet.

In the noise-cut filter device according to the second aspect of the invention, each of the first and second planar conductors of the each noise-cut filter may have a swirl-like shape, or a hoop-like shape. In this case, at least one corner portion of each of the first and second planar conductors may be formed with a predetermined radius of curvature.

In the noise-cut filter device as described just above, an area over which the first and second planar conductors of each noise-cut filter face each other may be controlled by trimming the second planar conductor for leading the current based on the noise to ground.

In one preferred form of the second aspect of the invention, each noise-cut filter has a through hole formed in a middle portion thereof, and the noise-cut filter device further includes magnetic core halves that surround an outer periphery of the noise-cut filters and are inserted through the through hole of each noise-cut filter. The core halves cooperate with the first and second planar conductors to provide a magnetic circuit.

In another preferred form of the second aspect of the invention, each noise-cut filter has a through hole formed in a middle portion thereof, the noise-cut filter device further includes an insulating, magnetic-powder-dispersed resin in which ferromagnetic powder is dispersed, for sealing an outer periphery of the noise-cut filters and the through hole of each noise-cut filter. The ferromagnetic powder cooperates with the first and second planar conductors to provide a magnetic circuit.

Each of the noise-cut filters of the above-described noise-cut filter device may be installed between the power converter and each of input conductors for transmitting input current to the power converter, or between the power converter and each of output conductors for receiving output current from the power converter. Each noise-cut filter may also be installed in each of conductor portions of a main circuit within the power converter.

According to the present invention, two planar conductors are formed on the upper and lower surfaces of the dielectric sheet, such that the conductors face each other through the dielectric sheet, to thus form a noise-cut filter having a distributed constant circuit. One of the conductors has a cross sectional area large enough to allow flow of current of a main circuit of the power converter, and the other converter has a cross sectional area large enough to allow flow of current based on switching noises. Thus, the resultant noise-cut filter is suitably employed for use in the power converter. One set of this sheet-like noise-cut filter or a plurality of sets of noise-cut filters that are connected in series may be equipped with a magnetic circuit formed by a magnetic body, so as to provide a small-sized noise-cut filter device for a power converter.

BRIEF DESCRIPTION OF THE DRAWINGS

The invention will be described in greater detail with reference to certain preferred embodiments thereof and the accompanying drawings, wherein.

DETAILED DESCRIPTION OF THE PREFERRED EMBODIMENTS

Figure 1A:
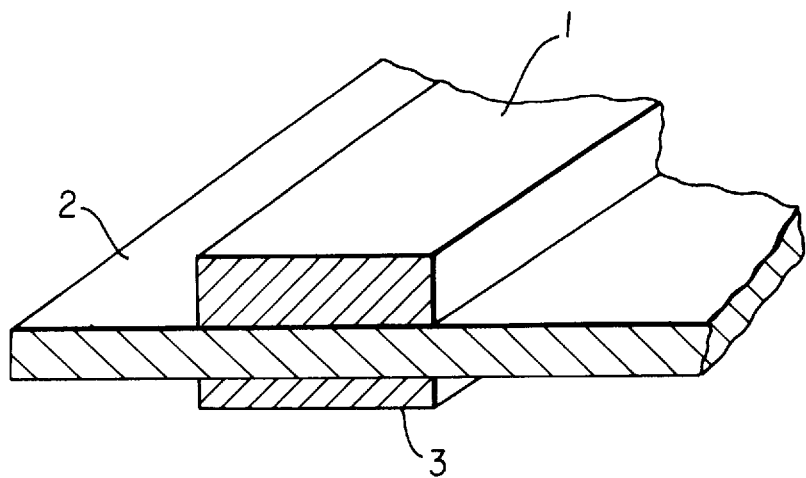
FIG. 1A is a view showing the construction of a noise-cut filter for a power converter according to the first embodiment of the present invention.

Some embodiments of the noise-cut filter for the power converter of the present invention will be hereinafter described referring to the accompanying drawings. In these embodiments, the same reference numerals are used to identify functionally corresponding elements.

Figure 1B:
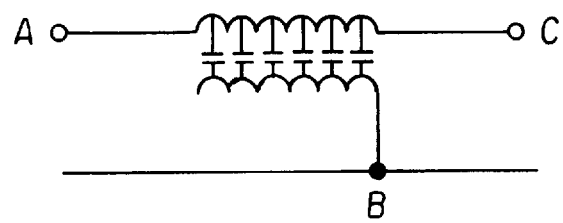
FIG. 1B is a view showing an equivalent circuit of the filter of FIG. 1A.

FIG. 1A is a perspective view showing a part of the construction of the first embodiment of the invention in the form of a noise-cut filter for a power converter. FIG. 1B shows an equivalent circuit of this filter.

In FIG. 1A, the noise-cut filter includes a conductor 1, which is a planar conductor having a cross sectional area large enough to allow flow of current of a main circuit of the power converter, a dielectric sheet 2, and a ground conductor 3, which is a planar conductor that faces the conductor 1 through the dielectric sheet 2. Since the ground conductor 3 is only required to lead to ground the current of a noise component flowing into this through the dielectric sheet 2, its cross sectional area may be smaller than that of the conductor 1.

In FIG. 1B, terminals A and C of the conductor 1 are spaced from each other by a predetermined length, such that minute inductance is continuously distributed between these terminals. Similarly, minute inductance is continuously distributed in the ground conductor 3 that leads to a terminal B. With the conductor 1 facing the ground conductor 3 through the dielectric sheet 2, minute capacitance is continuously formed between these conductors 1, 3, to thus provide a distributed constant circuit that serves as a low-pass filter, as shown in FIG. 1B.

The dielectric sheet 2 may be formed of various dielectric materials, such as polymeric resins including aromatic polyamide, polysulfon, polyphenylene sulfide, polyimide, polyamide imide, triazine containing resin, polyvinyl phenol, polyvinylidene fluoride, phenol resin, epoxy resin, polyester, and Teflon. The dielectric sheet 2 may also be formed by using paper or glass cloth as a substrate which is impregnated with or contains the above-indicated polymeric resin.

In another form of the invention, the dielectric sheet 2 is formed by using epoxy resin mixed with a given amount of a ceramic filler having a $BaTiO_3$ base, or a ceramic filler having a Pb base.

In a further form of the invention, a ceramic material having a $BaTiO_3$ base or Pb base, or PZT may be used as a material for forming the dielectric sheet 2.

Figure 2:
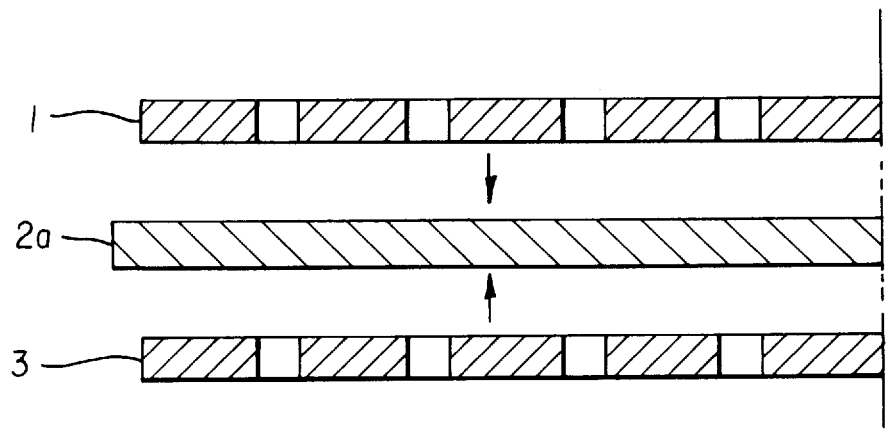
FIG. 2 is a cross sectional view showing a noise-cut filter for a power converter according to the second embodiment of the present invention.

FIG. 2 is a cross sectional view showing the structure of a noise-cut filter for a power converter according to the second embodiment of the present invention. In FIG. 2, the dielectric sheet is formed from a green sheet 2a of a ceramic dielectric material, and the conductor 1 and ground conductor 3 are formed by pressing metal (copper or aluminum) plates into desired shapes. These conductors 1, 3 are stuck with pressure onto the opposite main surfaces of the green sheet 2a, and bonded together with the sheet 2a by sintering, to provide a noise-cut filter equivalent to that of the first embodiment.

Figure 3:
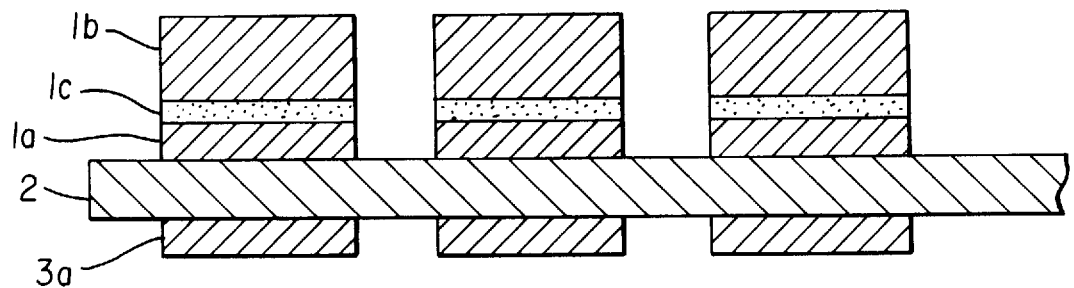
FIG. 3 is a cross sectional view showing a noise-cut filter for a power converter according to the third embodiment of the present invention.

FIG. 3 is a cross sectional view showing the structure of a noise-cut filter for a power converter according to the third embodiment of the present invention. In this embodiment, a metallic sheet 1a, such as a copper foil, fixed to the dielectric sheet 2 is processed into a desired shape by etching, and a metallic sheet 1b that is punched into the desired shape by press working is bonded to the metallic sheet 1a by means of a solder 1c, so as to increase the amount of current flowing through the conductor 1. In this process, the metallic sheet 1a is coated with the solder 1c in the form of paste, by screen printing or other method, and then the metallic plate 1b is heated and soldered to the sheet 1a. The ground conductor 3 may be formed in the same manner as the conductor 1, or may be formed solely of a metallic sheet 3a subjected to etching, as shown FIG. 3.

Figure 4:
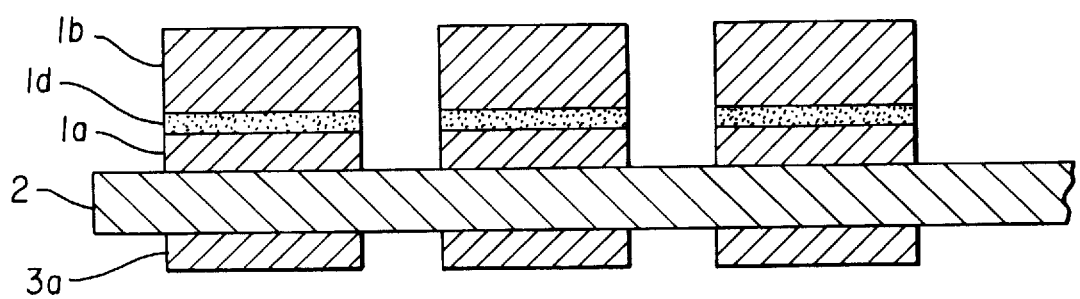
FIG. 4 is a cross sectional view showing a noise-cut filter for a power converter according to the fourth embodiment of this invention.

FIG. 4 is a cross sectional view showing the structure of a noise-cut filter for a power converter according to the third embodiment of the invention. In this embodiment, a metallic sheet 1a, such as a copper foil, fixed to the dielectric sheet 2 is processed into a desired shape by etching, and a metallic sheet 1b that is punched into the desired shape by press working is bonded to the metallic sheet 1a by means of a conductive bonding material 1d, so as to increase the amount of current flowing through the conductor 1. In this process, the metallic sheet 1a may be coated by screen printing or other method with the conductive bonding material 1d in which silver powder is dispersed in a resin, for example, and then the metallic plate 1b may bonded to the sheet 1a. The ground conductor 3 may be formed in the same manner as the conductor 1, or may be formed solely of a metallic sheet 3a subjected to etching, as shown FIG. 4.

Figure 5:
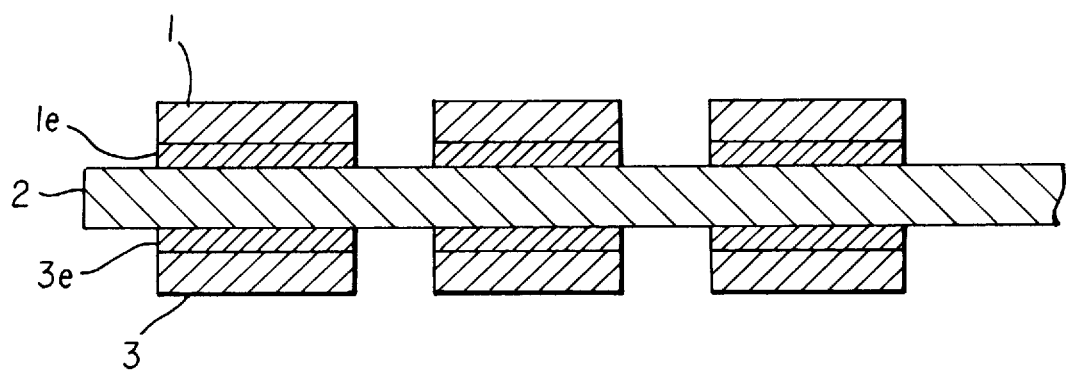
FIG. 5 is a cross sectional view showing a noise-cut filter for a power converter according to the fifth embodiment of this invention.

FIG. 5 is a cross sectional view showing the structure of a noise-cut filter for a power converter according to the fifth embodiment of the present invention. In this embodiment, metallic films 1e, 3e of copper or aluminum are formed by vapor deposition or sputtering on the upper and lower surfaces of the dielectric sheet 2, using masks having a predetermined pattern. Copper is then laminated by plating on the metallic films 1e, 3e, to provide the conductor 1 and the ground conductor 3.

Figure 6:
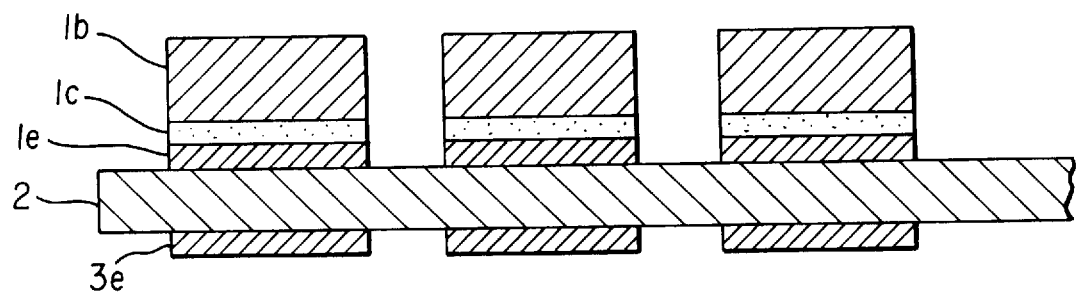
FIG. 6 is a cross sectional view showing a noise-cut filter for a power converter according to the sixth embodiment of this invention.

FIG. 6 is a cross sectional view showing the structure of a noise-cut filter for a power converter according to the sixth embodiment of the present invention. In this embodiment, metallic films 1e, 3e of copper or aluminum are formed by vapor deposition or sputtering on the upper and lower surfaces of the dielectric sheet 2, using masks having a predetermined pattern. A metallic sheet 1b that has been punched into a desired shape by press working is then bonded to the metallic film 1e, by means of a solder 1c. The ground conductor 3 may be formed in the same manner as the conductor 1, or may be formed solely of the metallic film 3e as shown in FIG. 6.

Figure 7:
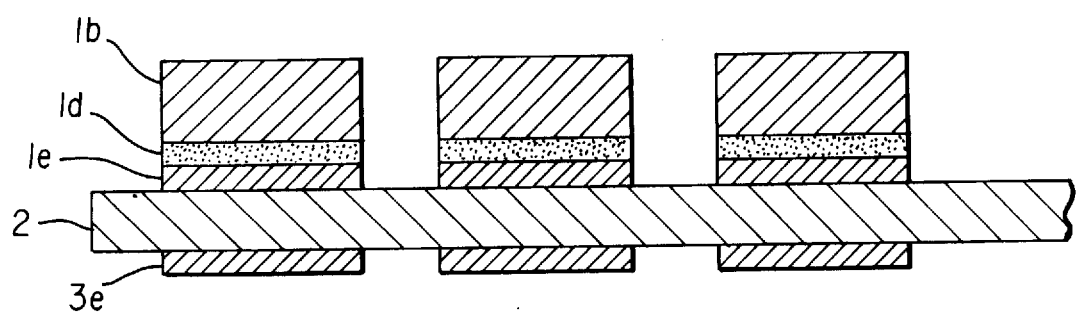
FIG. 7 is a cross sectional view showing a noise-cut filter for a power converter according to the seventh embodiment of this invention.

FIG. 7 is a cross sectional view showing the structure of a noise-cut filter for a power converter according to the seventh embodiment of the present invention. In this embodiment, metallic films 1e, 3e of copper or aluminum are formed by vapor deposition or sputtering on the upper and lower surfaces of the dielectric sheet 2, using masks having a predetermined pattern. A metallic sheet 1b that has been punched into a desired shape by press working is then bonded to the metallic film 1e, by means of a conductive bonding material 1d. The ground conductor 3 may be formed in the same manner as the conductor 1, or may be formed solely of the metallic film 3e as shown in FIG. 7.

Figure 8A:
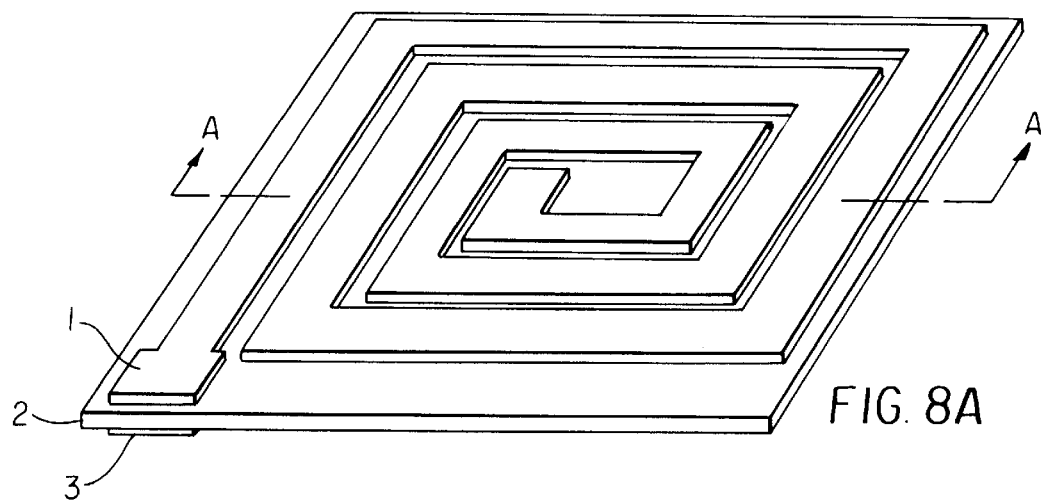
FIG. 8A is a perspective view of a noise-cut filter for a power converter according to the eighth embodiment of this invention.
Figure 8B:
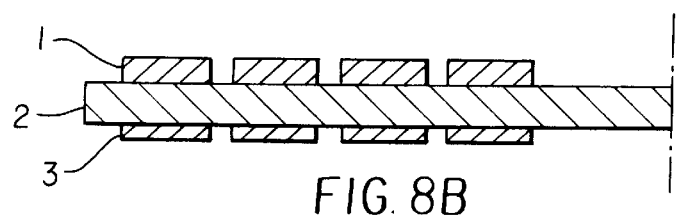
FIG. 8B is a cross sectional view of the noise-cut filter of FIG. 8A.

FIG. 8 is a view schematically showing a noise-cut filter for a power converter according to the eighth embodiment of the present invention. The conductor 1 and the ground conductor 3 of the first to seventh embodiments may be formed as shown in FIG. 8. FIG. 8A is a perspective view of the noise-cut filter, and FIG. 8B is a cross sectional view taken along line A—A of FIG. 8A. In FIG. 8A, the conductor 1 has a swirl-like shape, and the ground conductor 3 having the same shape is disposed on the rear side of the dielectric sheet 2. As shown in FIG. 8B, the cross sectional area of the ground conductor 3 is made smaller than that of the conductor 1.

Figure 9:
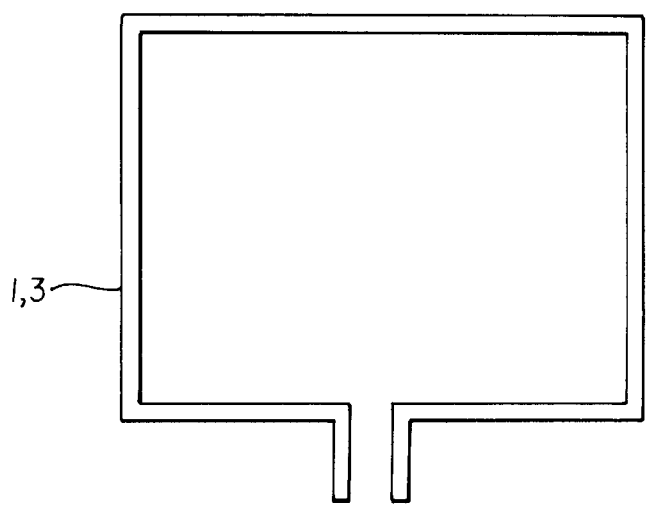
FIG. 9 is a view showing a planar conductor of a noise-cut filter for a power converter according to the ninth embodiment of the present invention.

FIG. 9 is a view schematically showing a noise-cut filter for a power converter according to the ninth embodiment of the invention. The conductor 1 and the ground conductor 3 of the first to seventh embodiments may be formed as shown in FIG. 9. In this embodiment, the conductor 1 has a hoop-like shape, and the ground conductor 3 (not shown) having the same shape is disposed on the rear side of the dielectric sheet 2, to face the conductor 1 through the sheet 2.

Figure 10:
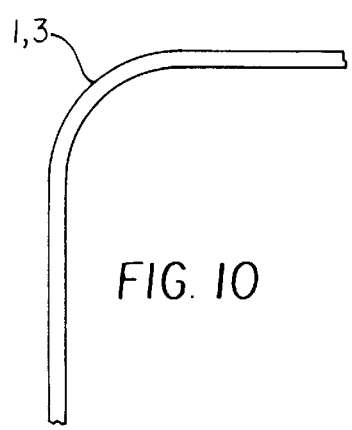
FIG. 10 is a view showing a corner portion of a planar conductor of a noise-cut filter for a power converter according to the tenth embodiment of this invention.

FIG. 10 is a view schematically showing a noise filter for a power converter according to the tenth embodiment of the present invention. A part of the conductor 1 and a part of the ground conductor 3 of the eighth or ninth embodiment may be formed as shown in FIG. 10. Namely, each corner portion of the swirl-like or hoop-like conductor 1 and ground conductor 3 as described above may be curved with a given radius of curvature, so as to avoid current concentration on the inner side of the corner portion, thereby preventing excessive heat from being generated due to the current concentration.

Figure 11:
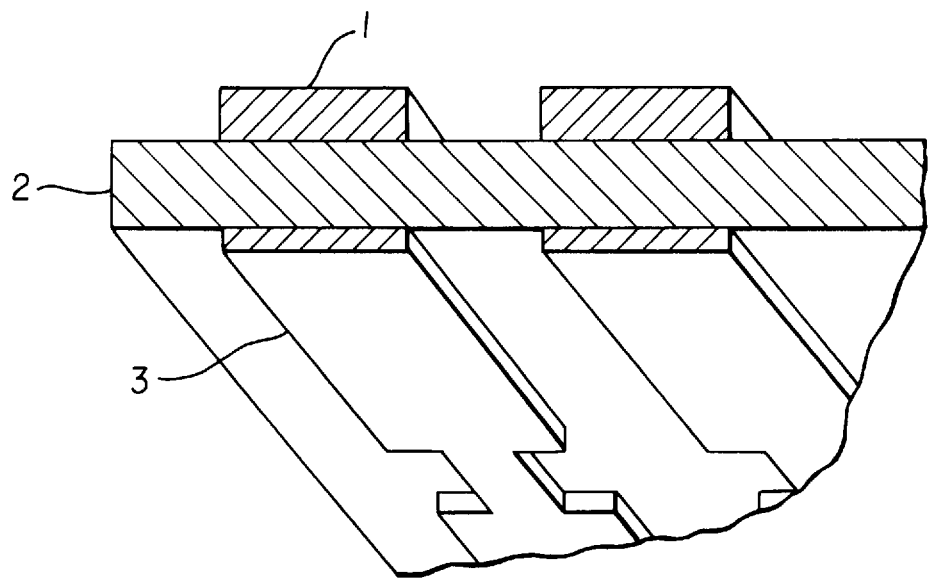
FIG. 11 is a perspective view showing a noise-cut filter for a power converter according to the eleventh embodiment of the present invention.

FIG. 11 is a view schematically showing a noise-cut filter for a power converter according to the eleventh embodiment. In this embodiment, the capacity of the condenser constituted by the conductors 1, 3 separated by the dielectric sheet 2 can be controlled to a desired value, by trimming the ground conductor 3 so as to reduce the area of the conductor 3 that faces the conductor 1.

Figure 12:
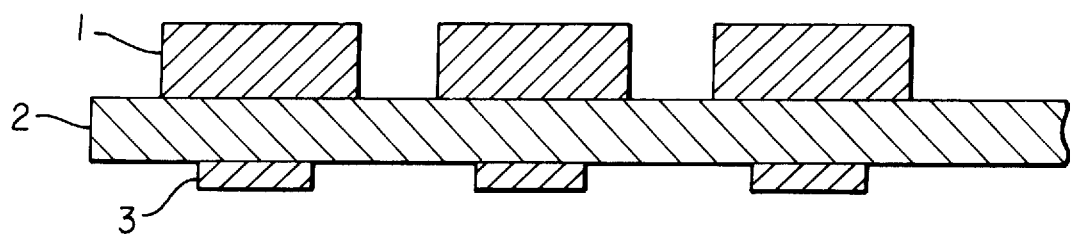
FIG. 12 is a cross sectional view of a noise-cut filter for a power converter according to the twelfth embodiment of the present invention.

FIG. 12 is a schematic view of a noise-cut filter for a power converter according to the twelfth embodiment of the invention. In this embodiment, the capacity of the condenser constituted by the conductors 1, 3 separated by the dielectric sheet 2 can be controlled to a desired value, by reducing the area of the ground conductor 3 that faces the conductor 1 by press working, as shown in FIG. 12.

Figure 13:
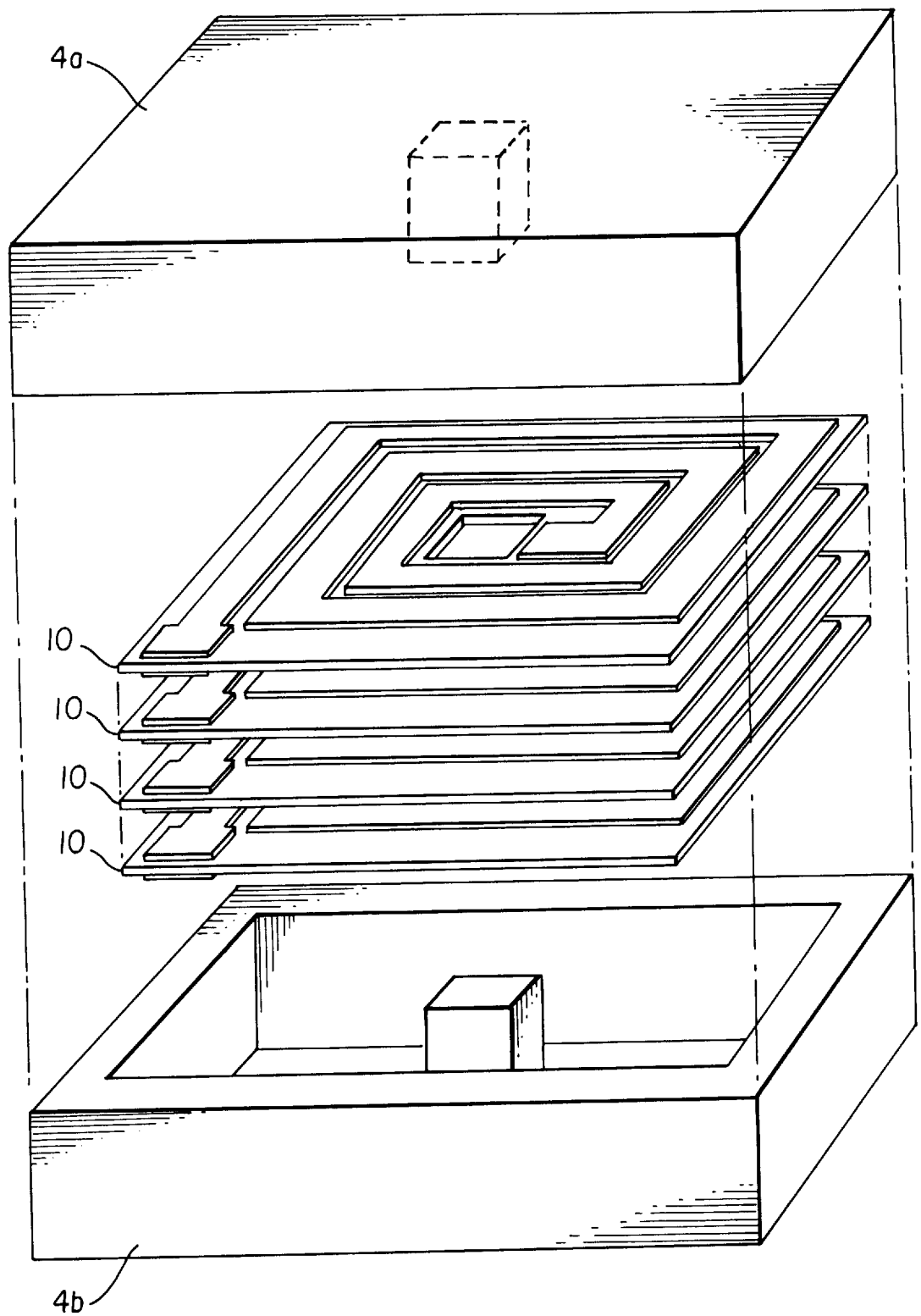
FIG. 13 is an exploded view showing a noise-cut filter device for a power converter according to the thirteenth embodiment of the present invention.

FIG. 13 is a schematic view of a noise-cut filter device for a power converter according to the thirteenth embodiment of the present invention. In this embodiment, a plurality of noise-cut filters 10 each consisting of the above-described conductor 1, dielectric sheet 2 and the ground conductor 3 have through holes formed through their middle portions, as shown in FIG. 13. These noise-cut filters 10 are stacked together with the through holes aligned with each other. Magnetic core halves 4a, 4b formed of ferrite, for example, are mounted on this stack of plural noise-cut filters 10 having the through holes, such that the cores 4a, 4b surround its outer periphery and extend through the through holes of the filters 10. Thus, a magnetic circuit is formed by the magnetic cores 4a, 4b, and the conductors 1 and ground conductors 3 of the plural noise-cut filters 10 for the power converter.

In the stack of the noise-cut filters 10, the terminal end of the conductor 1 of the first filter layer (uppermost noise-cut filter) 10 may be connected to the initial end of the conductor 1 of the second filter layer 10, and the terminal end of the conductor 1 of the second filter layer 10 may be connected to the initial end of the conductor 1 of the third filter layer 10, though such connectsion are not shown in the figure. Similarly, the terminal and initial ends of adjacent filter layers may be connected to each other so that the noise-cut filters 10 are serially connected. Alternatively, the initial ends of the respective filter layers may be connected to each other, and the terminal ends of the respective filter layers may be connected to each other, so that the noise-cut filters 10 are connected in parallel with each other. The ground conductors 3 may be connected to each other in similar manners, so that the noise-cut filters 10 are connected in series or in parallel with each other.

Figure 14:
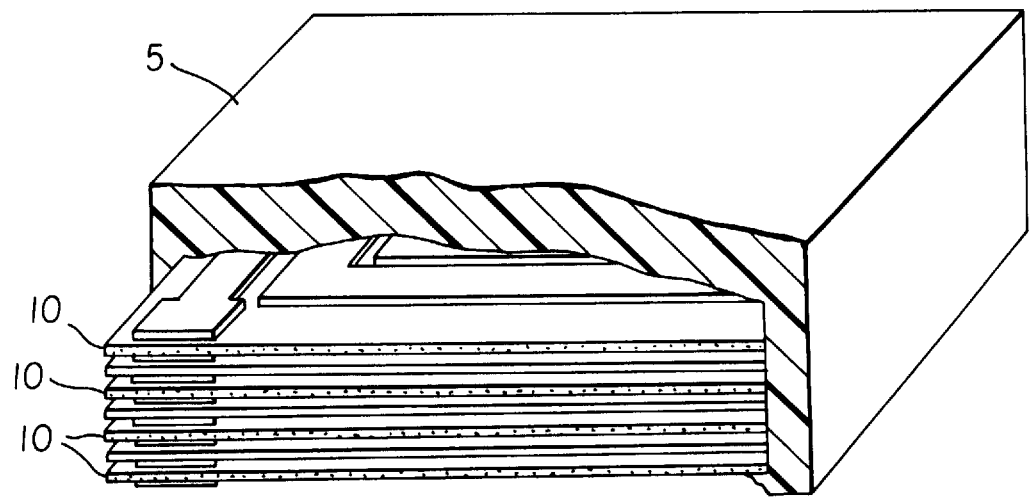
FIG. 14 is a partially cross sectional view showing a noise-cut filter device for a power converter according to the fourteenth embodiment of this invention.

FIG. 14 is a schematic view of a noise-cut filter device for a power converter according to the fourteenth embodiment of the present invention. In this embodiment, a plurality of noise-cut filters 10 have respective through holes formed through their middle portions and are stacked together, as in the embodiment of FIG. 13, and an insulating magnetic powder dispersed resin 5 in which ferromagnetic power is dispersed is provided to fill the holes and cover the outer peripheries of the filters 10, so as to seal the stack of the plural noise-cut filters 10. Thus, a magnetic circuit is formed by the magnetic power, and the conductors 1 and ground conductors 3 of the plural noise-cut filters 10 for the power converter.

In the stack of the noise-cut filters 10, the terminal end of the conductor 1 of the first filter layer (uppermost noise-cut filter) 10 may be connected to the initial end of the conductor 1 of the second filter layer 10, and the terminal end of the conductor 1 of the second filter layer 10 may be connected to the initial end of the conductor 1 of the third filter layer 10, though such connectsion are not shown in the figure. Similarly, the terminal and initial ends of adjacent filter layers may be connected to each other so that the noise-cut filters 10 are serially connected. Alternatively, the initial ends of the respective filter layers may be connected to each other, and the terminal ends of the respective filter layers may be connected to each other, so that the noise-cut filters 10 are connected in parallel with each other. The ground conductors 3 may be connected to each other in similar manners, so that the noise-cut filters 10 are connected in series or in parallel with each other.

Figure 15:
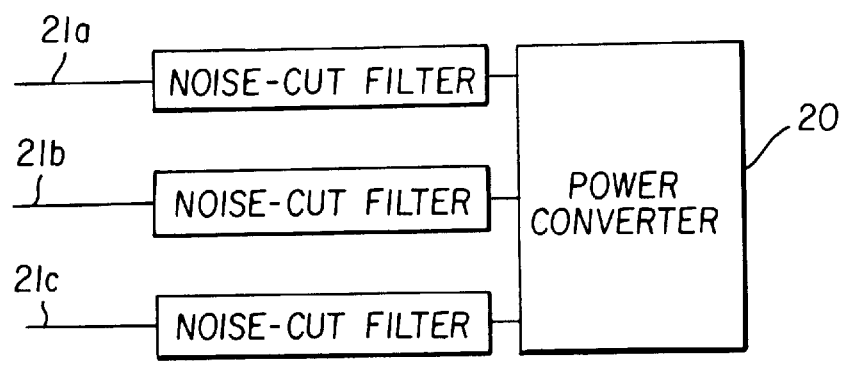
FIG. 15 is a block diagram of a power converter according to the fifteenth embodiment of the present invention.

FIG. 15 is a block diagram showing a power converter and noise-cut filters for the power converter according to the fifteenth embodiment of the present invention. In this embodiment, the noise-cut filters for the power converter as shown in FIG. 13 or FIG. 14 are respectively inserted between the power converter 20, such as an inverter, and corresponding input conductors 21a, 21b, 21c for transmitting input current into the power converter 20.

Figure 16:
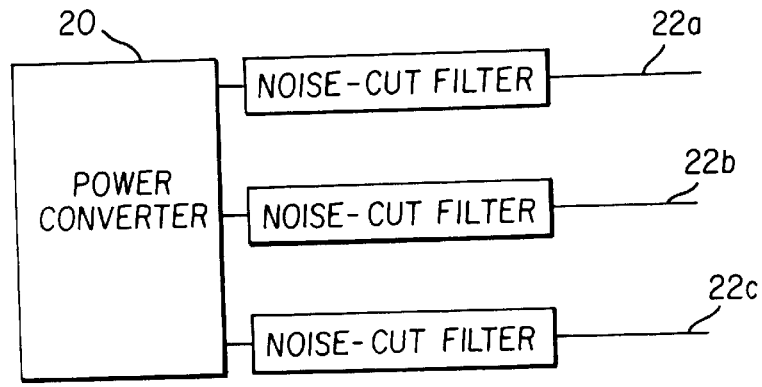
FIG. 16 is a block diagram of a power converter according to the sixteenth embodiment of the present invention.

FIG. 16 is a block diagram showing a power converter and noise-cut filters for the power converter according to the sixteenth embodiment of the invention. In this embodiment, the noise-cut filters for the power converters as shown in FIG. 13 or FIG. 14 are respectively inserted between the power converter 20, such as an inverter, and corresponding output conductors 22a, 22b, 22c for receiving output current from the power converter 20.

Figure 17:
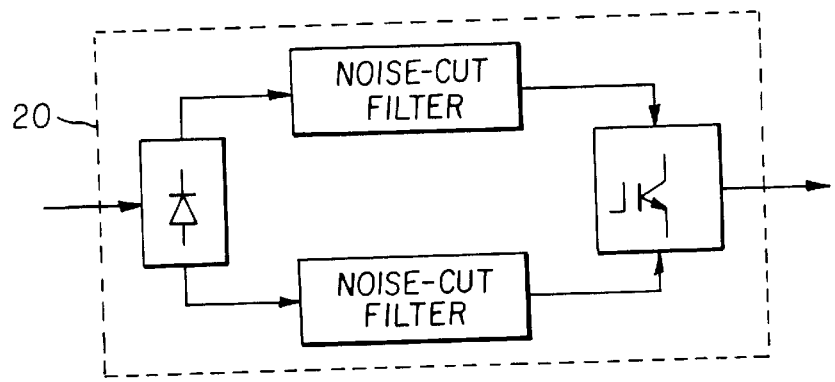
FIG. 17 is a block diagram of a power converter according to the seventeenth embodiment of the present invention.

FIG. 17 is a block diagram of a power converter and noise-cut filters for the power converter according to the seventeenth embodiment of the invention. In this embodiment, the noise-cut filters for the power converter as shown in FIG. 13 or FIG. 14 are respectively inserted in an intermediate direct circuit of the power converter 20, such as an inverter.

Figure 18:
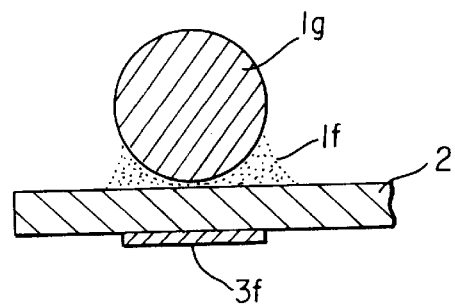
FIG. 18 is a cross sectional view of a noise-cut filter for a power converter according to the eighteenth embodiment of the present invention.

FIG. 18 is a cross sectional view of a noise-cut filter for a power converter according to the eighteenth embodiment of the present invention. In this embodiment, the upper and lower surfaces of the dielectric sheet 2 are coated with a given shape of conductive adhesive layers 1f, 3f in which silver power or the like is dispersed, and a metallic wire 1g, such as a copper wire, is bonded to the conductive adhesive layer 1f. The ground conductor 3 is formed solely of the conductive adhesive layer 3f, as shown in FIG. 18.

Figure 19:
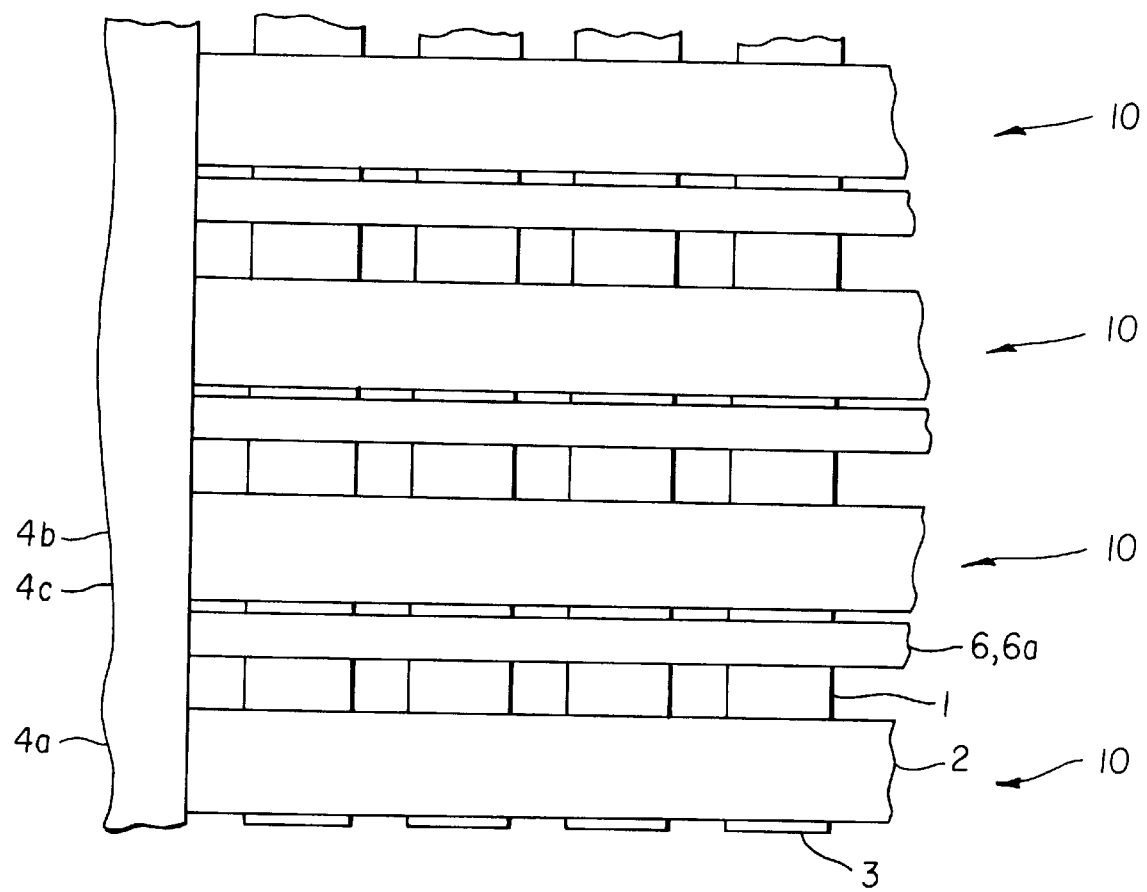
FIG. 19 is a cross sectional view showing a part of a noise-cut filter device for a power converter according to the nineteenth embodiment of the present invention.

FIG. 19 is a cross sectional view showing a part of a noise-cut filter device according to the nineteenth embodiment of the present invention. In this embodiment, conductive paste that provides the conductor 1 and/or ground conductor 3 is a mixture of conductive powder of platinum or silver, for example, an organic binder, such as ethyl cellulose or polyvinyl butyral, and an organic solvent, such as toluene or xylene. This mixture is printed in a given pattern on the surface(s) of a dielectric ceramic green sheet that provides the dielectric sheet 2. The dielectric ceramic green sheet is formed from a mixture of dielectric ceramic powder and the organic powder as indicated above, by a doctor blade method or other sheet forming method. A conductive ceramic green sheet that provides the conductor 1 and/or ground conductor 3 is obtained by forming a mixture of conductive power of platinum or silver, for example, and an organic binder, such as ethyl cellulose or polyvinyl butyral, into a planar shape by a doctor blade method or other sheet forming method.

Thereafter, these green sheet(s) and/or conductive paste are stuck with pressure into an integral body, which is then degreased at 450° C. and sintered at 1050° C. to form the noise-cut filter 10 for the power converter. A plurality of the thus formed noise cut filters 10 are stacked together, with insulating sheets 6 inserted between adjacent ones of the filters 10. A through hole is formed through middle portions of the respective noise-cut filters 10 and insulating sheets 6, as shown in FIG. 19, and magnetic core halves 4a made of ferrite, for example, are provided so as to fill these holes and surround the outer peripheries of the noise-cut filters 10. Thus, a magnetic circuit is formed by the magnetic cores 4a, and the conductors 1 and ground conductors 3 of the plural noise-cut filter 10 for the power converter.

In another embodiment similar to that of FIG. 19, a plurality of laminar bodies each consisting of the conductor 1, dielectric sheet 2 and ground conductor 3, are formed by a doctor blade method or other sheet forming method, for example, and insulating sheets 6 formed by a similar method are inserted between adjacent ones of these laminar bodies. These conductors and dielectric and insulating sheets 1, 2, 3, 6 are stuck together with pressure into an integral body, which is then formed at its middle portion with a through hole. Then, a magnetic ceramic green 4b is provided to fill the through hole and cover the outer periphery of the layered structure (stack of noise-cut filters), which is then degreased at 450° C., and sintered at 1050° C., to thus provide a filter device including the plural noise-cut filters.

The conductor, dielectric sheet 2 and ground conductor 3 used in this embodiment are similar to those of the nineteenth embodiment, and the insulating sheet 6 is formed from an insulating ceramic green sheet 6a made of a mixture of a ceramic powder of $Al_2O_3$, for example, and an organic binder, such as ethyl cellulose or polyvinyl butyral. The magnetic ceramic green 4c that forms the magnetic circuit is a mixture of ferrite powder and the organic powder as indicated above.

According to the present invention, two planar conductors are formed on the upper and lower surfaces of a dielectric sheet, such that the conductors face each other through the dielectric sheet, to thus form a noise-cut filter having a distributed constant circuit. This noise-cut filter is suitably used for a power converter, such that one of the conductors allows flow of current of a main circuit of the power converter, while the other conductor allows flow of current based on noises. One set of this sheet-like noise-cut filter or a plurality of sets of noise-cut filters that are connected in series may be equipped with a magnetic circuit formed by a magnetic body, so as to provide a small-sized noise-cut filter device for a power converter.

In the embodiments of FIG. 19, in particular, each material for forming the noise-cut filter may be processed, printed and stuck with pressure in its green state, and the thus formed bodies may be simultaneously sintered, whereby the noise-cut filter device for the power converter having desired characteristics can be easily manufactured at a low cost.

What is claimed is:

1. A noise-cut filter device for a power converter, including at least one noise-cut filter, for filtering switching noise occurring upon a switching operation of a semiconductor switching device of the power converter, wherein said noise-cut filter comprises first and second planar conductors, and a dielectric sheet having upper and lower surfaces on which said first and second planar conductors are disposed to face each other through the dielectric sheet such that said first and second planar conductors continuously overlap, said first and second planar conductors cooperating with said dielectric sheet to form a circuit having both functions of an inductor and a condenser, said first planar conductor having opposite ends through which a current of a main circuit of the power converter flows, said second planar conductor leading a current based on the noise to ground, which current flows from the first planar conductor to the second planar conductor through said dielectric sheet.

2. A noise-cut filter device as defined in claim 1, wherein said dielectric sheet of said noise-cut filter comprises a polymeric resin material.

3. A noise-cut filter device as defined in claim 1, wherein said dielectric sheet of said noise-cut filter comprises a polymeric resin material that is mixed with an inorganic filler having a high dielectric constant in a predetermined proportion.

4. A noise-cut filter device as defined in claim 1, wherein said dielectric sheet of said noise-cut filter comprises a ceramic material.

5. A noise-cut filter device as defined in claim 1, wherein said dielectric sheet of said noise-cut filter is formed from a green sheet of a ceramic dielectric material, and said first and second planar conductors are formed from respective metallic plates by press working, said metallic plates and said green sheet being stuck with pressure and sintered to provide said each noise-cut filter.

6. A noise-cut filter device as defined in claim 1, wherein at least one of said first and second planar conductors of said noise-cut filter comprises a first metallic plate fixed to a surface of said dielectric sheet and formed into a given shape by etching, and a second metallic plate that is pressed into the same shape as said first metallic plate, said second metallic plate being soldered to said first metallic plate.

7. A noise-cut filter device is defined in claim 1, wherein at least one of said first and second planar conductors of said noise-cut filter comprises a first metallic plate fixed to a surface of said dielectric sheet and formed into a given shape by etching, and a second metallic that is pressed into the same shape as said first metallic plate, said second metallic plate being bonded to said first metallic plate by a conductive adhesive.

8. A noise-cut filter device as defined in claim 1, wherein at least one of said first and second planar conductors of said noise-cut filter comprises a metallic film formed in a given pattern on a surface of said dielectric sheet by vapor deposition or sputtering, and a copper layer formed with a predetermined thickness on said metallic film by plating.

9. A noise-cut filter device as defined in claim 1, wherein at least one of said first and second planar conductors of said noise-cut filter comprises a metallic film formed in a given pattern on a surface of said dielectric sheet by vapor deposition or sputtering, and a metallic plate that is pressed into the same shape as said metallic film and soldered to said metallic film.

10. A noise-cut filter device as defined claim 1, wherein at least one of said first and second planar conductors of said noise-cut filter comprises a metallic film formed in a given pattern on a surface of said dielectric sheet by vapor deposition or sputtering, and a metallic plate that is pressed into the same shape as said metallic film and secured to the metallic film by means of a conductive adhesive.

11. A noise-cut filter device as defined in claim 5, wherein each of said first and second planar conductors of said noise-cut filter has a swirl-like shape.

12. A noise-cut filter device as defined in claim 5, wherein each of said first and second planar conductors of said noise-cut filter has a hoop-like shape.

13. A noise-cut filter device as defined in claim 11, wherein each of said first and second planar conductors of said noise-cut filter has at least one corner portion which is curved with a given radius of curvature.

14. A noise-cut filter device as defined in claim 11, wherein an area over which said first and second planar conductors of said noise-cut filter face each other is controlled by trimming said second planar conductor for leading the current based on the noise to ground.

15. A noise-cut filter device as defined in claim 11, wherein an area over which said first and second planar conductors of said noise-cut filter face each other is controlled by changing an area of said second planar conductor for leading the current based on the noise to ground.

16. A noise-cut filter device as defined in claim 11, wherein said noise-cut filter has a through hole formed in a middle portion thereof, said noise-cut filter device further comprising magnetic core halves that surround an outer periphery of said noise-cut filter and are inserted through said through hole of said noise-cut filter, said core halves cooperating with said first and second planar conductors to provide a magnetic circuit.

17. A noise-cut filter device as defined in claim 11, wherein said noise-cut filter has a through hole formed in a middle portion thereof, said noise-cut filter device further comprising an insulating, magnetic-powder-dispersed resin in which ferromagnetic powder is dispersed, for sealing an outer periphery of said noise-cut filter and said through hole of said noise-cut filter, sad ferromagnetic powder cooperating with said first and second planar conductors to provide a magnetic circuit.

18. A noise-cut filter device as defined in claim 16, wherein said noise-cut filter is installed between said power converter and each of input conductors for transmitting input current to the power converter.

19. A noise-cut filter device as defined in claim 16, wherein said noise-cut filter is installed between said power converter and each of output conductors for receiving output current from the power converter.

20. A noise-cut filter device as defined in claim 16, wherein said noise-cut filter is inserted in each of conductor portions of a main circuit within the power converter.

21. A noise-cut filter device as defined in claim 1, wherein said dielectric sheet is formed from a dielectric ceramic green sheet obtained by forming a mixture of a dielectric ceramic powder and an organic binder into a planar shape, said first and second planar conductors being formed by printing patterned conductive pastes comprising a conductive powder, an organic binder and an organic solvent, onto upper and lower surfaces of said dielectric ceramic green sheet, respectively, said patterned conductive pastes and said dielectric ceramic green sheet being concurrently degreased and sintered so as to form said noise-cut filter.

22. A noise-cut filter device as defined in claim 1, wherein said dielectric sheet is formed from a dielectric ceramic green sheet obtained by forming a mixture of a dielectric ceramic powder and an organic binder into a planar shape, said first and second planar conductors being formed from first and second conductive ceramic green sheets comprising a mixture of a conductive powder and an organic binder, said first and second conductive ceramic green sheets being respectively formed in a predetermined pattern on upper and lower surfaces of said dielectric ceramic green sheet, said first and second conductive ceramic green sheets and said dielectric ceramic green sheet being brought into pressure-sticking with each other, and concurrently degreased and sintered so as to form said noise-cut filter.

23. A noise-cut filter device as defined in claim 1, wherein said dielctric sheet is formed from a dielectric ceramic green sheet obtained by forming a mixture of a dielectric ceramic powder and an organic binder into a planar shape, one of said first and second planar conductors being formed by printing a patterned conductive paste comprising a conductive powder, an organic binder and an organic solvent, onto a first surface of said dielectric ceramic green sheet, the other of said first and second planar conductors being formed from a conductive ceramic green sheet comprising a mixture of conductive powder and an organic binder, said conductive ceramic green sheet being formed in a predetermined pattern on a second surface of said dielectric ceramic green sheet, said patterned conductive paste, said dielectric ceramic green sheet and said conductive ceramic green sheet being concurrently degreased and sintered so as to form said noise-cut filter.

24. A noise-cut filter device as defined in claim 1, wherein said dielectric sheet is formed from a dielectric ceramic sheet obtained by forming a mixture of a dielectric ceramic powder and an organic binder into a planar shape, said first said second planar conductors being formed by printing patterned conductive pastes comprising a conductive powder, an organic binder and an organic solvent, onto upper and lower surfaces of said dielectric ceramic green sheet, said noise-cut filter device further comprising a plurality of insulating sheets inserted between adjacent ones of said plurality of noise-cut filters, each of said insulating sheets being formed from an insulating ceramic green sheet obtained by forming a mixture of an insulating ceramic powder and an organic binder into a planar shape, said dielectric ceramic green sheet, said patterned conductive pastes, and said insulating ceramic green sheet being brought into pressure-sticking with each other, and concurrently degreased and sintered so as to provide each of said plurality of noise-cut filters.

25. A noise-cut filter device as defined in claim 1, wherein said dielectric sheet is formed from a dielectric ceramic sheet obtained by forming a mixture of a dielectric ceramic powder and an organic binder into a planar shape, said first and second planar conductors being formed from a first and second conductive ceramic green sheets comprising a mixture of a conductive powder and an organic binder, said first and second conductive ceramic green sheets being respectively formed in a predetermined pattern on upper and lower surfaces of said dielectric ceramic sheet, said noise-cut filter device further comprising a plurality of insulting sheets inserted between adjacent ones of said plurality of noise-cut filters, each of said insulating sheets being formed from an insulating ceramic green sheet obtained by forming a mixture of an insulating ceramic powder and an organic binder into a planar shape, said dielectric ceramic green sheet, said conductive ceramic green sheets, and said insulating ceramic green sheet being brought into pressure-sticking with each other, and concurrently degreased and sintered so as to provide each of said plurality of noise-cut filters.

26. A noise-cut filter device as defined in claim 1, wherein said dielectric sheet is formed from a dielectric ceramic green sheet obtained by forming a mixture of a dielectric ceramic powder and an organic binder into a planar shape, one of said first and second planar conductors being formed by printing a patterned conductive paste comprising a conductive powder, an organic binder and an organic solvent, onto a first surface of said dielectric ceramic green sheet, the other of said first and second planar conductors being formed from a conductive ceramic green sheet comprising a mixture of a conductive powder and an organic binder, said conductive ceramic green sheet being formed in a predetermined pattern on a second surface of said dielectric ceramic green sheet, said noise-cut filter device further comprising a plurality of insulating sheets inserted between adjacent ones of said plurality of noise-cut filters, each of said insulating sheets being formed from an insulating ceramic green sheet obtained by forming a mixture of an insulating ceramic powder and an organic binder into a planar shape, said dielectric ceramic green sheet, said patterned conductive paste, said conductive ceramic green sheet, and said insulating ceramic green sheet being brought into pressure-sticking with each other, and concurrently degreased and sintered so as to provide each of said plurality of said noise-cut filters.

27. A noise-cut filter device as defined in claim 1, wherein said dielectric sheet is formed from a dielectric ceramic sheet obtained by forming a mixture of a dielectric ceramic powder and an organic binder into a planar shape, said first and second planar conductors being formed by printing patterned conductive pastes comprising a conductive powder, an organic binder and an organic solvent, onto upper and lower surfaces of said dielectric ceramic green sheet, said noise-cut filter device further comprising a plurality of insulating sheets inserted between adjacent ones of said plurality of noise-cut filters, each of said insulating sheets being formed from an insulating ceramic green sheet obtained by forming a mixture of insulating ceramic powder and an organic binder into a planar shape, said dielectric ceramic green sheet, said conductive pastes, and said insulating ceramic green sheet being brought into pressure-sticking with each other to form an integral green body, which is then formed with a through hole extending through a middle portion thereof, said noise-cut filter device further comprising a magnetic body formed from a magnetic ceramic green as a mixture of a magnetic ceramic powder and an organic binder, said magnetic ceramic green filling said through hole and surrounding an outer periphery of said integral green body, said magnetic ceramic green and said integral green body being concurrently degreased and sintered so as to provide each of said plurality of noise-cut filters.

28. A noise-cut filter device as defined in claim 1, wherein said dielectric sheet is formed from a dielectric ceramic sheet obtained by forming a mixture of a dielectric ceramic powder and an organic binder into a planar shape, said first and second planar conductors being formed from first and second conductive ceramic green sheets comprising a mixture of a conductive powder and an organic binder, said first and second conductive ceramic green sheets being respectively formed in a predetermined pattern on upper and lower surfaces of said dielectric ceramic sheet, said noise-cut filter device further comprising a plurality of insulating sheets inserted between adjacent ones of said plurality of noise-cut filters, each of said insulating sheets being formed from an insulating ceramic green sheet obtained by forming a mixture of an insulating ceramic powder and an organic binder into a planar shape, said dielectric ceramic green sheet, said conductive ceramic green sheets, and said insulating ceramic green sheet being brought into pressure-sticking with each other to form an integral green body, which is then formed with a through hole extending through a middle portion thereof, said noise-cut filter device further comprising a magnetic body formed from a magnetic ceramic green as a mixture of a magnetic ceramic powder and an organic binder, said magnetic ceramic green filling said through hole and surrounding an outer periphery of said integral green body, said magnetic ceramic green and said integral green body being concurrently degreased and sintered so as to provide each of said plurality of noise-cut filters.

29. A noise-cut filter device as defined in claim 1, wherein said dielectric sheet is formed from a dielectric ceramic green sheet obtained by forming a mixture of a dielectric ceramic powder and an organic binder into a planar shape, one of said first and second planar conductors being formed by printing a patterned conductive paste comprising a conductive powder, an organic binder and an organic solvent, onto a first surface of said dielectric ceramic green sheet, the other of said first and second planar conductors being formed from a conductive ceramic green sheet comprising a mixture of conductive powder and an organic binder, said conductive ceramic green sheet being formed in a predetermined pattern on a second surface of said dielectric ceramic green sheet, said noise-cut filter device further comprising a plurality of insulating sheets inserted between adjacent ones of said plurality of noise-cut filters, each of said insulating sheets being formed from an insulating ceramic green sheet obtained by forming a mixture of an insulating ceramic powder and an organic binder into a planar shape, said dielectric ceramic green sheet, said patterned conductive paste, said conductive ceramic green sheet, and said insulating ceramic green sheet being brought into pressure-sticking with each other to form all integral green body, which is then formed with a through hole extending through a middle portion thereof, said noise-cut filter device further comprising a magnetic body formed from a magnetic ceramic green as a mixture of a magnetic ceramic powder and an organic binder, said magnetic ceramic green filling said through hole and surrounding an outer periphery of said integral green body, said magnetic ceramic green and said integral green body being concurrently degreased and sintered so as to provide each of said plurality of noise-cut filters.

30. A noise-cut filter device for a power converter, including at least one noise-cut filter, for filtering switching noise occurring upon a switching operation of a semiconductor switching device of the power converter, wherein said noise-cut filter comprises first and second conductors, and a dielectric sheet having first and second surfaces on which said first and second conductors are disposed to face each other through the dielectric sheet such that said first and second conductors continuously overlap, said first and second conductors cooperating with said dielectric sheet to form a circuit having both functions of an inductor and a condenser;

wherein said first conductor formed on the first surface of said dielectric sheet has opposite ends through which a current of a main circuit of the power converter flows; and wherein said second conductor comprises a conductive adhesive formed in a given shape on the second surface of said dielectric sheet by coating, for leading a current based on the noise to ground, which current flows from the first conductor to the second conductor through said dielectric sheet.

31. A noise-cut filter device as defined in claim 30, wherein said first conductor comprises a conductive adhesive formed in a given shape on the first surface of said dielectric sheet by coating, and a metallic wire fixed to said conductive adhesive.

32. A noise-cut filter device as defined in claim 30, wherein each of said first and second planar conductors of said noise-cut filter has a swirl-like shape.

33. A noise-cut filter device as defined in any claim 30, wherein each of said first and second planar conductors of said noise-cut filter has a hoop-like shape.

34. A noise-cut filter device as defined in claim 32, wherein at least one corner portion of each of said first and second planar conductors is formed with a predetermined radius of curvature.

35. A noise-cut filter device as defined in claim 32, wherein an area over which said first and second planar conductors of said noise-cut filter face each other is controlled by trimming said second planar conductor for leading the current based on the noise to ground.

36. A noise-cut filter device as defined in claim 30, wherein said noise-cut filter has a through hole formed in a middle portion thereof, said noise-cut filter device further comprising magnetic core halves that surround an outer periphery of said noise-cut filters and are inserted through said through hole of said noise-cut filter, said core halves cooperating with said first and second planar conductors to provide a magnetic circuit.

37. A noise-cut filter device as defined in claim 30, wherein said noise-cut filter has a through hole formed in a middle portion thereof, said noise-cut filter device further comprising an insulating, magnetic-powder-dispersed resin in which ferromagnetic powder is dispersed, for sealing an outer periphery of said noise-cut filter and said through hole of said noise-cut filter, said ferromagnetic powder cooperating with said first and second planar conductors to provide a magnetic circuit.

38. A noise-cut filter device as defined in claim 27, wherein said noise-cut filter is installed between said power converter and each of input conductors for transmitting input current to the power converter.

39. A noise-cut filter device as defined in claim 27, wherein said noise-cut filter is installed between said power converter and each of output conductors for receiving output current from the power converter.

40. A noise-cut filter device as defined in claim 27, wherein said noise-cut filter is inserted in each of conductor portions of a main circuit within said power converter.

* * * * *